United States Patent
Moabber et al.

(10) Patent No.: US 11,552,556 B2
(45) Date of Patent: Jan. 10, 2023

(54) ELECTROMAGNETIC EMISSION REJECTION FILTER IN HYBRID/ELECTRIC VEHICLES

(71) Applicant: Volvo Car Corporation, Gothenburg (SE)

(72) Inventors: Kooros Moabber, Mölndal (SE); Per Åke Lindbeck, Gothenburg (SE); Fredrik Alexander Forsberg, Mölndal (SE)

(73) Assignee: Volvo Car Corporation, Gothenburg (SE)

( * ) Notice: Subject to any disclaimer, the term of this patent is extended or adjusted under 35 U.S.C. 154(b) by 0 days.

(21) Appl. No.: 17/342,386

(22) Filed: Jun. 8, 2021

(65) Prior Publication Data

US 2021/0391785 A1    Dec. 16, 2021

Related U.S. Application Data

(60) Provisional application No. 63/039,819, filed on Jun. 16, 2020.

(51) Int. Cl.
```
H02M 1/44      (2007.01)
H02M 1/12      (2006.01)
H02M 7/00      (2006.01)
```
(52) U.S. Cl.
CPC .............. *H02M 1/44* (2013.01); *H02M 1/126* (2013.01); *H02M 7/003* (2013.01)

(58) Field of Classification Search
CPC ......... H02M 1/44; H02M 1/126; H02M 7/003
See application file for complete search history.

(56) References Cited

U.S. PATENT DOCUMENTS

2002/0117318 A1 * 8/2002 Suzuki ............... H01R 13/7197
174/51
2020/0067478 A1    2/2020 Kim et al.

FOREIGN PATENT DOCUMENTS

| CN | 203734632 U |   | 7/2014  |
|----|-------------|---|---------|
| CN | 209805612 U | * | 12/2019 |
| CN | 209805612 U |   | 12/2019 |

OTHER PUBLICATIONS

Krambeck, "A Brief Introduction to the Common Mode Choke and Its Applications," allaboutcircuits.com, Apr. 23, 2017, 6 pp.
(Continued)

*Primary Examiner* — Jue Zhang
(74) *Attorney, Agent, or Firm* — Shumaker & Sieffert, P.A.

(57) ABSTRACT

The disclosure describes techniques to filter unwanted noise from feedback signals of an electrical machine. An electrical machine may receive AC power from an inverter and circuitry in the inverter may cause noise on the AC power signals to the electrical machine. The noise may couple to sensors for the electrical machine and cause noise in the sensor output signals. The sensor output signals may provide feedback for a closed loop control system for the electrical machine and noise may impact the closed loop operation. Also, the noise in the feedback signals may cause electromagnetic compatibility (EMC) issues, either by direct radiated emissions or by coupling to other circuits in the vehicle wiring harness as the feedback signals travel from the electrical machine. The techniques of this disclosure may include filter circuitry located near or inside the electrical machine that filters out the unwanted noise in the feedback signals.

20 Claims, 4 Drawing Sheets

(56) References Cited

OTHER PUBLICATIONS

Extended Search Report from counterpart European Application No. 21179588.5 dated Nov. 17, 2022, 7 pp.
Response to Communication Pursuant to Rule 69 EPC dated Jan. 4, 2022, from counterpart European Application No. 21179588.5, filed May 24, 2022, 8 pp.

* cited by examiner

ELECTROMAGNETIC EMISSION REJECTION FILTER IN HYBRID/ELECTRIC VEHICLES

This application claims the benefit of U.S. Provisional Patent Application No. 63/039,819, filed 16 Jun. 2020, the entire contents of which is incorporated herein by reference.

TECHNICAL FIELD

The disclosure relates to filtering signals for electromagnetic compatibility.

BACKGROUND

Electric and hybrid vehicles, and similarly electrically powered equipment may include a direct current (DC) power source such as a battery, that drives one or more electrical machines. For example, the drive train of the electric or hybrid-electric vehicle may control an electrical machine that receives three-phase power from an inverter configured to convert the power from the DC power source into alternating current (AC) power. Processing circuitry may receive feedback signals from the electrical machine in the drive train and adjust the output of the inverter based on the received feedback signals.

SUMMARY

In general, the disclosure describes techniques to filter unwanted noise from feedback signals of an electrical machine, such as an electrical machine in the drive train of an electric vehicle. In the example of an electrical machine that receives AC power from an inverter, the switching circuitry in the inverter may superimpose noise on the power signals received by the electrical machine. The noise may couple to one or more sensors inside the electrical machine and cause noise in the output signals from the one or more sensors. The sensor output signals, which may include temperature, speed and position of the electrical machine, may act as feedback signals for a closed loop control system for the electrical machine. The noise in the feedback signals may impact the closed loop operation of the electrical machine. Also, the noise in the feedback signals may cause electromagnetic compatibility (EMC) issues, either by direct radiated emissions or by coupling to other circuits in the vehicle wiring harness as the feedback signals travel from the electrical machine to processing circuitry that may operate the closed loop control system. The techniques of this disclosure may include filter circuitry located inside or very close to the electrical machine that filters out the unwanted noise in the feedback signals.

In one example, the disclosure is directed to a method comprising: receiving, by an inverter circuitry, electrical energy from a direct-current (DC) power source, converting, by the inverter circuitry, the received electrical energy into three-phase alternating-current (AC) power, outputting, by the inverter circuitry, the three-phase power to an electrical machine, wherein the output three-phase power comprises a noise, sensing, by a sensor, one or more characteristics of the electrical machine, outputting, by the sensor, a feedback signal. The feedback signal comprises: an indication of the one or more characteristics of the electrical machine, and the noise, wherein the sensor receives the noise from the electrical machine. The method may further include receiving, by a filter circuit, the feedback signal from the sensor, removing, by the filter circuit, the noise from the feedback signal, receiving, by the inverter circuitry, the feedback signal from the filter circuit, and adjusting, by the inverter circuitry, the three-phase power output to the electrical machine based on the indication of the one or more characteristics of the electrical machine.

In another example, a system comprising: an electrical machine configured to drive a mechanical load, an inverter circuitry configured to provide power to the electrical machine, a sensor configured to measure a characteristic of the electrical machine and output a first signal indicating the measured characteristic. The system may also include a filter circuit configured to receive the first signal from the sensor, remove noise from the first signal, output a second signal indicating the measured characteristic.

In another example, the disclosure is directed to an apparatus comprising: a filter circuit configured to: receive a feedback signal from a sensor. The feedback signal comprises a feedback information component and a noise component. The apparatus is further configured to remove the noise component from the feedback signal and output the feedback signal comprising the information component. The apparatus also may include inverter circuitry configured to: receive DC power and output AC power receive the feedback signal from the filter circuit and adjust the output AC power based on the received information component of the feedback signal.

The details of one or more examples of the disclosure are set forth in the accompanying drawings and the description below. Other features, objects, and advantages of the disclosure will be apparent from the description and drawings, and from the claims.

DETAILED DESCRIPTION

This disclosure describes techniques to filter unwanted noise from feedback signals of an electrical machine, such as an electrical machine in the drive train of an electric vehicle, to improve electrical performance and elevate electromagnetic compatibility. For an electrical machine that receives AC power from an inverter, the switching circuitry in the inverter may cause noise on the power signals received by the electrical machine. The noise may couple to one or more sensors inside the electrical machine and cause noise in the output signals from the one or more sensors. The sensor output signals may include temperature, speed and position of the electrical machine and may act as feedback signals for a closed loop control system for the electrical machine. The noise in the feedback signals may impact the closed loop operation of the electrical machine that can affect the performance of output AC power to electrical machine. Also, the noise in the feedback signals may couple to other circuits in a wiring harness as the feedback signals travel from the electrical machine to disturb electrically or electromagnetically processing circuitry of other units that may operate the closed loop control system. In some examples, the noise may cause issues with other components of the equipment powered by the electrical machine. In some examples, the noise may also radiate and cause electromagnetic compatibility (EMC) issues with sensitive equipment. In this disclosure, the term "noise" means any type of electrical or electromagnetic noise, unless otherwise noted.

The techniques of this disclosure may include filter circuitry located inside or very close, e.g. mounted on or adjacent to the electrical machine that filters out the unwanted noise in the feedback signals. Locating the filtering circuitry close to the electrical machine may prevent noise from coupling to the wiring harness. Also, filtering the feedback signals may result in compact, lightweight, and inexpensive filtering circuitry when compared to other electromagnetic compatibility (EMC) management techniques.

Figure 1:
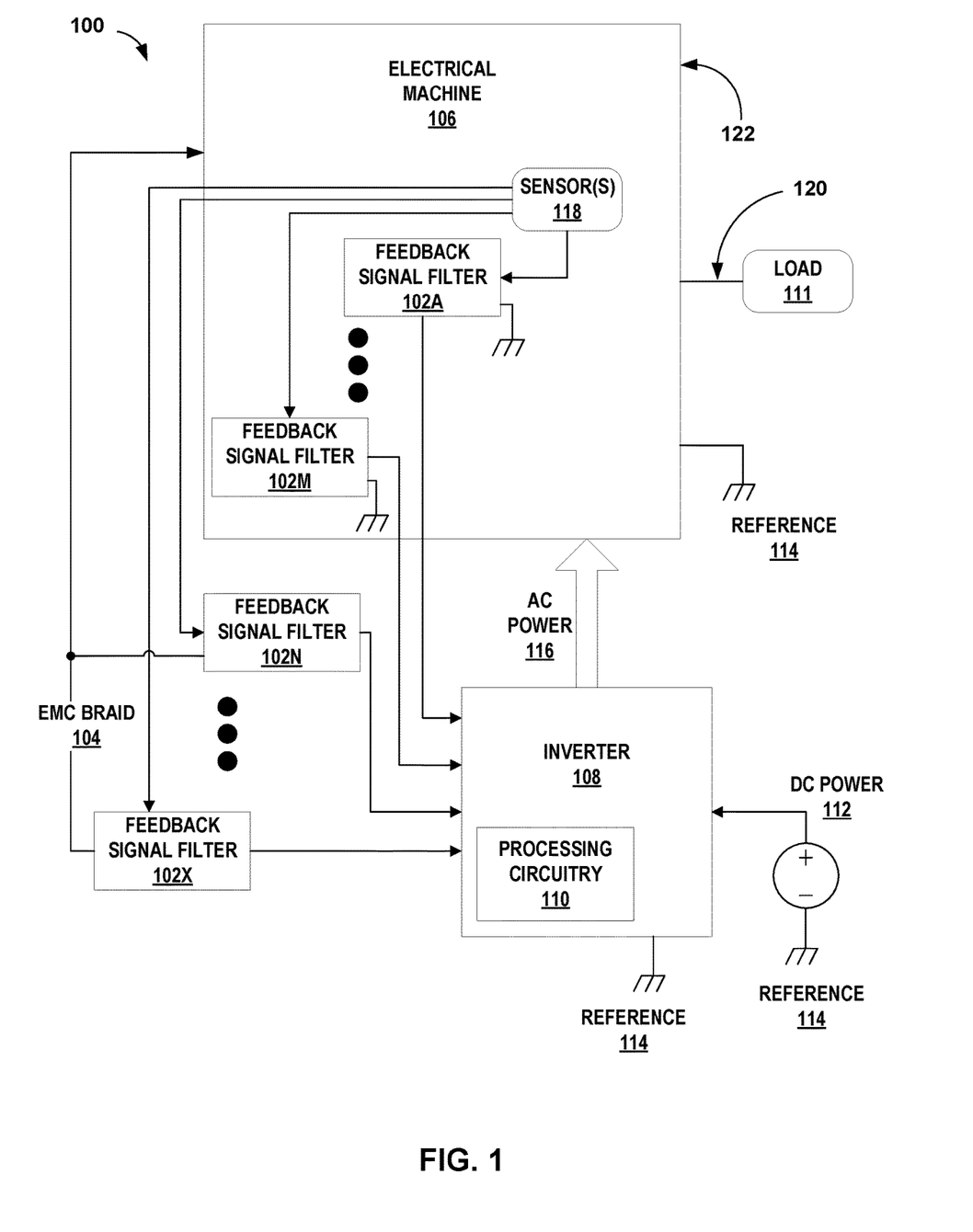
FIG. 1 is a block diagram illustrating an electrical machine driven by an inverter that include feedback filtering according to one or more techniques of this disclosure.

FIG. 1 is a block diagram illustrating an electrical machine driven by an inverter that include feedback filtering according to one or more techniques of this disclosure. The example of system 100 may drive a variety of loads 111, which may include the drive train of an electric or hybrid-electric vehicle, a pumping station, a hoist, crane or other similar loads. In some examples, DC power source 112 may be charged by a solar photovoltaic (PV) system or some other charging system (not shown in FIG. 1). Examples of a vehicle may include cars, trucks, buses, motorcycles, recreational vehicles (RVs), tractors, all-terrain vehicles, watercraft, or any other type of vehicle.

In the example of FIG. 1, system 100 includes electrical machine 106 configured to drive load 111, inverter circuitry 108 (shown as inverter 108), DC power source 112, and feedback signal filters 102A-102X. In some examples, inverter circuitry 108 may also include processing circuitry 110. In other examples, processing circuitry 110 may be separate from inverter circuitry 108 but operatively coupled to inverter circuitry 108.

Electrical machine 106 may be any type of electrical motor configured to operate with AC power 116, such as synchronous and asynchronous machines. In some examples, power 116 from inverter circuitry 108 may be single phase, three-phase or any other type of AC power. Electrical machine 106 may be configured and sized to drive large or small loads 111 at a variety of speeds and torque output. Electrical machine 106 may also be configured to stop and start from any position of angular rotation. For example, shaft 120 may rotate with respect to a reference angular position, e.g. a reference angle of zero degrees or zero radians. Electrical machine 106 may be configured to start at a first angular deviation from the reference angle and stop at a second angular deviation from the reference position.

Electrical machine 106 may include electrical and mechanical components surrounded by and protected by a housing 122. In some examples, electrical machine may include shaft 120, bearings to support shaft 120, electrical windings or coils, and other related components.

Electrical machine 106 may also include one or more sensors 118 configured to sense one or more characteristics of electrical machine 106. Some examples of sensors may include a resolver configured to measure a speed and a position of an electrical machine, a temperature sensor, a current sensor configured to measure a magnitude of current, an impedance sensor, a Hall effect sensor, a speed sensor, a voltage sensor, a volt-ampere reactive (vars) sensor, and a radiated emission sensor. In some examples the current sensor and vars sensor may be configured to measure the magnitude of power used by one or more phases of electrical machine 106. In some examples one or more of sensors 118 may be mounted within the housing 122 of electrical machine 106. In other examples, one or more of sensors 118 may be mounted on the exterior of the housing 122 of electrical machine 106. For example, a first temperature sensor of sensors 118 may be configured to measure shaft temperature, windings temperature or other temperatures within electrical machine 106, while a second temperature sensor may be configured to measure external temperature of the environment around electrical machine 106. In some examples, the resolver may be configured to output sine and/or cosine information, which may provide angular position and speed.

Loads 111 may be any type of load, as noted above, such as a vehicle drivetrain. In some examples, load 111 may be configured to convert angular rotation into lateral movement.

Inverter circuitry 108 is configured to receive DC power and output AC power 116. Inverter circuitry 108 may include switching circuits that convert the received DC power into AC power, such that the AC power signal approximates a sine wave shaped signal. The switching circuits may also generate a noise component that may be superimposed on the AC power signal. The noise component may include any number of frequencies and harmonics of frequencies. In some examples, the noise component is carried along with the AC power signal to electrical machine 106.

In some examples, inverter circuitry 108 may be operatively connected to processing circuitry 110. In the example of a vehicle, processing circuitry 110 may receive data, commands and other information from other processors and systems within the vehicle. Processing circuitry 110 may also receive feedback signals from the one or more sensors 118 which may indicate measured characteristics of electrical machine 106. In some examples, processing circuitry 110 may adjust the operation of inverter circuitry 108 based on the measured characteristic. In other words, processing circuitry 110 may operate as part of a closed loop control system for electrical machine 106 and adjust the output AC power 116 based on a received information component of the feedback signal. For example, a temperature sensor of sensors 118 may indicate that electrical machine 106 has exceeded a temperature threshold. Processing circuitry 110 may reduce the amplitude, frequency or some other characteristic of AC power 116 to help reduce the operating temperature of electrical machine 106.

Examples of processing circuitry 110 may include any one or more of a microcontroller (MCU), e.g. a computer on a single integrated circuit containing a processor core, memory, and programmable input/output peripherals, a microprocessor (μP), e.g. a central processing unit (CPU) on a single integrated circuit (IC), a controller, a digital signal processor (DSP), an application specific integrated circuit (ASIC), a field-programmable gate array (FPGA), a system on chip (SoC) or equivalent discrete or integrated logic circuitry. A processor may be integrated circuitry, i.e., integrated processing circuitry, and that the integrated processing circuitry may be realized as fixed hardware processing circuitry, programmable processing circuitry and/or a combination of both fixed and programmable processing circuitry. Accordingly, the terms "processing circuitry," "processor" or "controller," as used herein, may refer to any one or more of the foregoing structures or any other structure operable to perform techniques described herein.

In some examples, processing circuitry 110 may include computer-readable storage media, such as a microcontroller. In other examples, processing circuitry 110 may be operatively coupled to separate computer-readable storage media. In this disclosure computer-readable storage media may include random access memory (RAM), read only memory (ROM), programmable read only memory (PROM), erasable programmable read only memory (EPROM), electronically erasable programmable read only memory (EEPROM), flash memory, and similar devices. In some examples the computer readable storage media may store instructions that cause the processing circuitry to execute the functions described herein. In some examples, the computer readable storage media may store data, such as configuration information, temporary values and other types of data used to perform the functions of this disclosure.

In some examples the noise generated by switching circuits of inverter circuitry 108 may couple to one or more of sensors 118. In some examples, noise within motor coils of one or more phases of electrical machine 106 may couple to sensors 118. The feedback signal from sensors 118 may include both a feedback information component and a noise component. In other words, the feedback signal may include both an indication of the one or more characteristics of the electrical machine (e.g. temperature or speed), and a noise frequency superimposed on the feedback signal. The sensor may receive the noise frequency from electrical machine 106. As described above, the noise component may include many different noise frequencies, including harmonics of noise frequencies.

Should inverter circuitry 108 receive feedback signals with both the feedback information component along with the noise component, the combined feedback signal may negatively impact the closed loop operation of inverter circuitry 108. In some examples, the noise component comprising one or more noise frequencies may cause processing circuitry 110 to apply control signals to inverter circuitry 108 based on the noise component. In some examples, the noise component may cause processing circuitry 110 to inaccurately process the information component of the feedback signals, e.g. processing circuitry 110 may determine that the feedback signal indicates a speed that is higher or lower than the actual speed of electrical machine 106. In some examples, the noise component in the feedback signal may also be further superimposed on AC power 116 output by inverter circuitry 108.

Feedback signal filters 102A-102X are configured to receive the feedback signal from the sensor and remove noise, such as the noise frequency or frequencies, from the feedback signal. In other words, feedback signal filters 102A-102X include a filter circuit that will receive a first signal from a sensor of sensors 118 remove at least some of the noise from the first signal and output a second signal indicating the measured characteristic. The output second signal sent to inverter circuitry 108 will include the measured characteristic, e.g. current magnitude or angular position, but will remove, or at least reduce the magnitude, of the noise component coupled to the sensor from electrical machine 106. In some examples, feedback signal filters 102A-102X may be implemented using analog components. In other examples, feedback signal filters 102A-102X may be implemented as digital filters or some combination of both analog and digital filtering.

Feedback signal filters adjacent to electrical machine 106, but outside of housing 122, e.g. feedback signal filters 102N-102X connect to electrical machine 106 via EMC braid 104. EMC braid 104 may be implemented as any type of electrical conductor with a low impedance current path. In some examples EMC braid 104 may be implemented as a braided wire conductor. In other examples, EMC braid 104 may be implemented as a relatively large diameter wire. EMC braid 104 may conduct the filtered noise component from feedback signal filters 102N-102X on the exterior of housing 122 back to electrical machine 106.

Electrical machine 106, inverter circuitry 108, DC power source 112 and other components of system 100 may connect to reference 114. Reference 114 may act as the system ground for system 100. In some examples, such as for a vehicle, reference 114 may be the chassis ground for the vehicle. In the example of a building or similar structure, reference 114 may also connect to protective earth ground. Feedback signal filters 102A-102M located within housing 122 may connect to the same reference as electrical machine 106.

Feedback signal filters 102A-102X may be of any number of feedback signal filters of system 100. In some examples, each sensor of sensors 118 may connect to a separate feedback signal filter. In other examples, two or more feedback signals from two or more sensors may connect to a single feedback signal filter of feedback signal filters 102A-102X.

Feedback signal filters 102A-102X may be located inside, near or mounted on electrical machine 106. In the example of system 100, feedback signal filters 102A-102M are located inside the housing 122 of electrical machine 106. Feedback signal filters 102N-102X may be located near, e.g. adjacent to or mounted on housing 122 of electrical machine 106. The signal path from sensors 118 of electrical machine 106 may travel several centimeters to a meter or more before reaching inverter circuitry 108. In the example of system 100, feedback signal filters 102A-102X may be mounted inside, close to or adjacent to electrical machine 106 such that the signal path between electrical machine 106 and the feedback signal filters is much shorter than the signal path between the feedback signal filters and inverter circuitry 108. The location of feedback signal filters 102A-102X in system 100 may provide an advantage over other locations because the feedback signal filters may reduce or remove the noise component before the feedback signal travels down the remainder of the signal path to inverter circuitry 108. The remainder of the signal path may run near, or in the same wire harness as other signals in the overall system, e.g. a vehicle, hoist, and so on. By filtering the noise before the feedback signal travels along the remainder of the signal path, feedback signal filters 102A-102X may prevent the noise from coupling to other conductors in the wire harness. Also, in some examples, the remainder of the signal path may be long enough to act as an antenna. Noisy signals in the remainder of the signal path may cause noise to radiate into the environment. Coupled or radiated noise may affect other circuits outside the electrical machine. Said another way, noise in the feedback signals may cause electromagnetic compatibility (EMC) issues, either by direct radiated emissions or by coupling to other circuits in the vehicle wiring harness as the feedback signals travel from the electrical machine to processing circuitry. In other words, the filter circuits of feedback signal filters 102A-102X may be located adjacent to the electrical machine such that the filter circuit is configured to prevent noise from the feedback signals from coupling to circuits outside the electrical machine.

The arrangement of system 100 may provide advantages over other examples of systems that include inverters. Rather than filtering the noise at the output of inverter circuitry 108, the techniques of this disclosure filter the output signals of the sensors by using filter circuits located close to, e.g. adjacent to, electrical machine 106. In this manner, the filter circuits of this disclosure may use smaller, less expensive and lighter components for the relatively low power sensor output signals. In contrast, filtering the high-power signals of AC power 116 may require components with high current ratings, which may increase the cost, weight and size of the filter components. In addition, filtering noise from AC power 116 may also dissipate at least some of AC power 116 as heat and therefore provide less efficient use of the energy from DC power source 112 to electrical machine 106. In the example of an electric vehicle, the techniques of this disclosure may increase the range, because of the improved efficiency and lighter weight, when compared to other techniques. By locating feedback signal filters 102A-102X near electrical machine 106, e.g. in contrast to including filter circuits at inverter circuitry 108, the techniques of this disclosure may prevent noise from coupling to the vehicle wiring harness or radiating to impact other circuits outside of electrical machine 106. In some examples, including feedback signal filters 102A-102X in the feedback loop may reduce the amount of noise coupled onto AC power 116.

Figure 2:
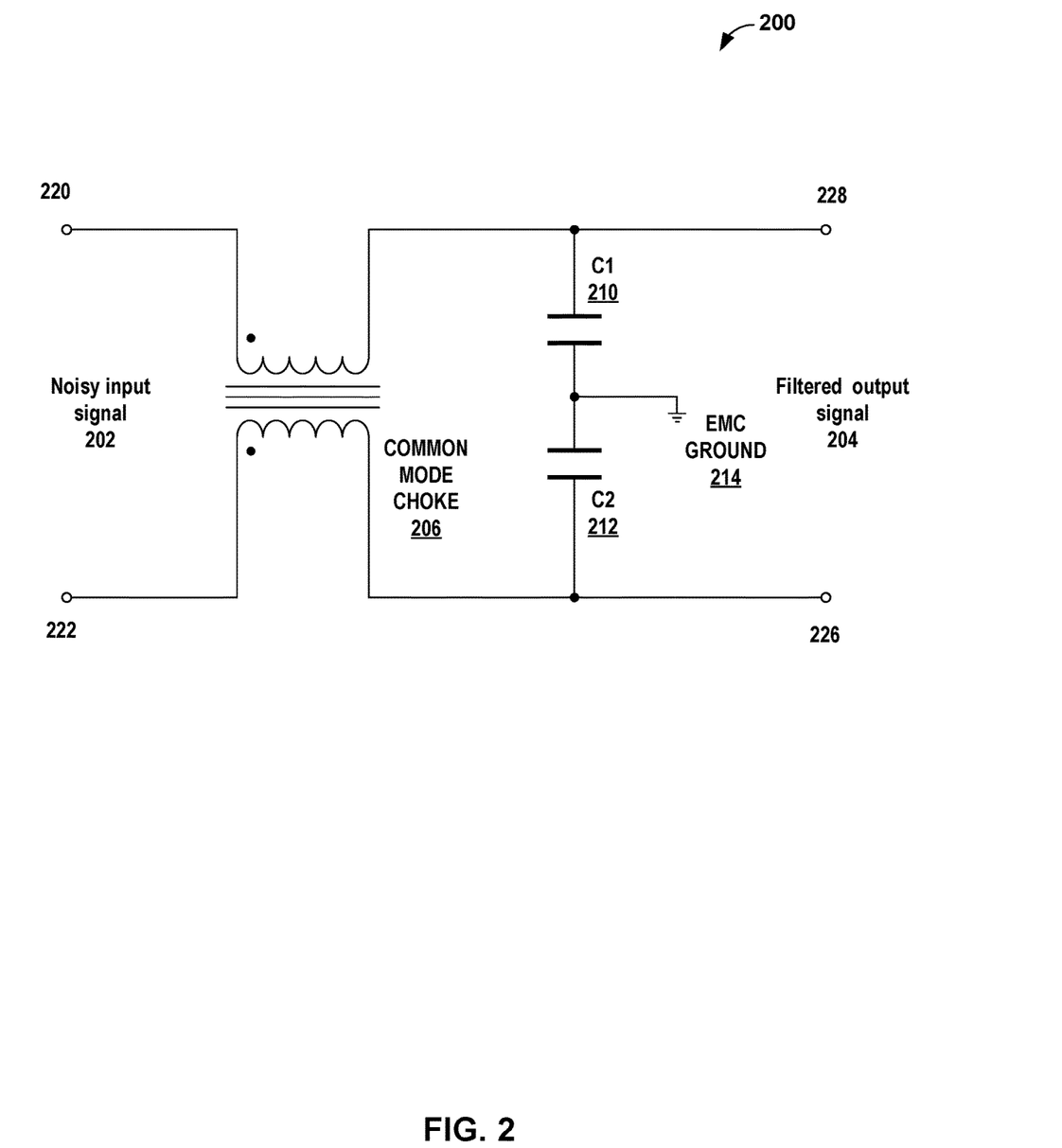
FIG. 2 is a schematic diagram illustrating an example feedback filter circuit according to one or more techniques of this disclosure.

FIG. 2 is a schematic diagram illustrating an example feedback filter circuit according to one or more techniques of this disclosure. Circuit 200 is one possible implementation of a filter circuit for feedback signal filters 102A-102X described above in relation to FIG. 1.

In the example of FIG. 2, a noisy input signal 202 from a sensor of sensors 118 described above in relation to FIG. 1, connects to input terminals 220 and 222. Input terminals 220 and 222 are also input terminals for common mode choke 206. In some examples, input terminal 220 may be considered a "line terminal" and input terminal 222 may be considered a "neutral terminal." Output terminal 228 of common mode choke 206 is therefore a line terminal and output terminal 226 is the neutral terminal in the example of circuit 200. Circuit 200 outputs filtered output signal 204 from output terminals 228 and 226.

Capacitor C1 210 in series with capacitor C2 212 connects output terminal 228 to output terminal 226. EMC ground 214 connects to the node between capacitor C1 210 and capacitor C2 212. EMC ground 214 may electrically connect to EMC braid 104 described above in relation to FIG. 1.

Common mode choke 206 includes line and neutral windings that are wound on a single core. The "line" winding connects terminal 220 to terminal 228 and the neutral winding connects terminal 222 to terminal 226 in the example of circuit 200. Therefore terminals 220 and 228 are electrically isolated from terminals 222 and 226, but magnetically coupled to terminals 222 and 226. In operation, common mode choke 206 is an electrical filter that blocks high frequency noise common to the line and neutral windings while allowing the desired signal with the information component to pass.

Noise coupled to a sensor of sensors 118 may be coupled on both output lines of the sensor, and therefore be coupled as common mode noise. In common mode, the current in the line and neutral windings travel in the same direction, so the combined magnetic flux adds to create an opposing field to block the common mode noise. Characteristics of a common mode choke include the impedance at a selected frequency band, the electrical current rating and so on. In the example of circuit 200, selecting the characteristics of common mode choke 206 may determine the frequencies of common mode noise coupled to the feedback signal to be attenuated or removed.

The series combination of capacitors C1 210 and C2 212 is in parallel with common mode choke 206. Capacitors C1 210 and C2 212 may conduct additional AC signals to EMC ground 214. For example, capacitor C2 212 may conduct an AC signal, e.g. voltage ripple, at neutral output terminal 226 to EMC ground 214.

Figure 3:
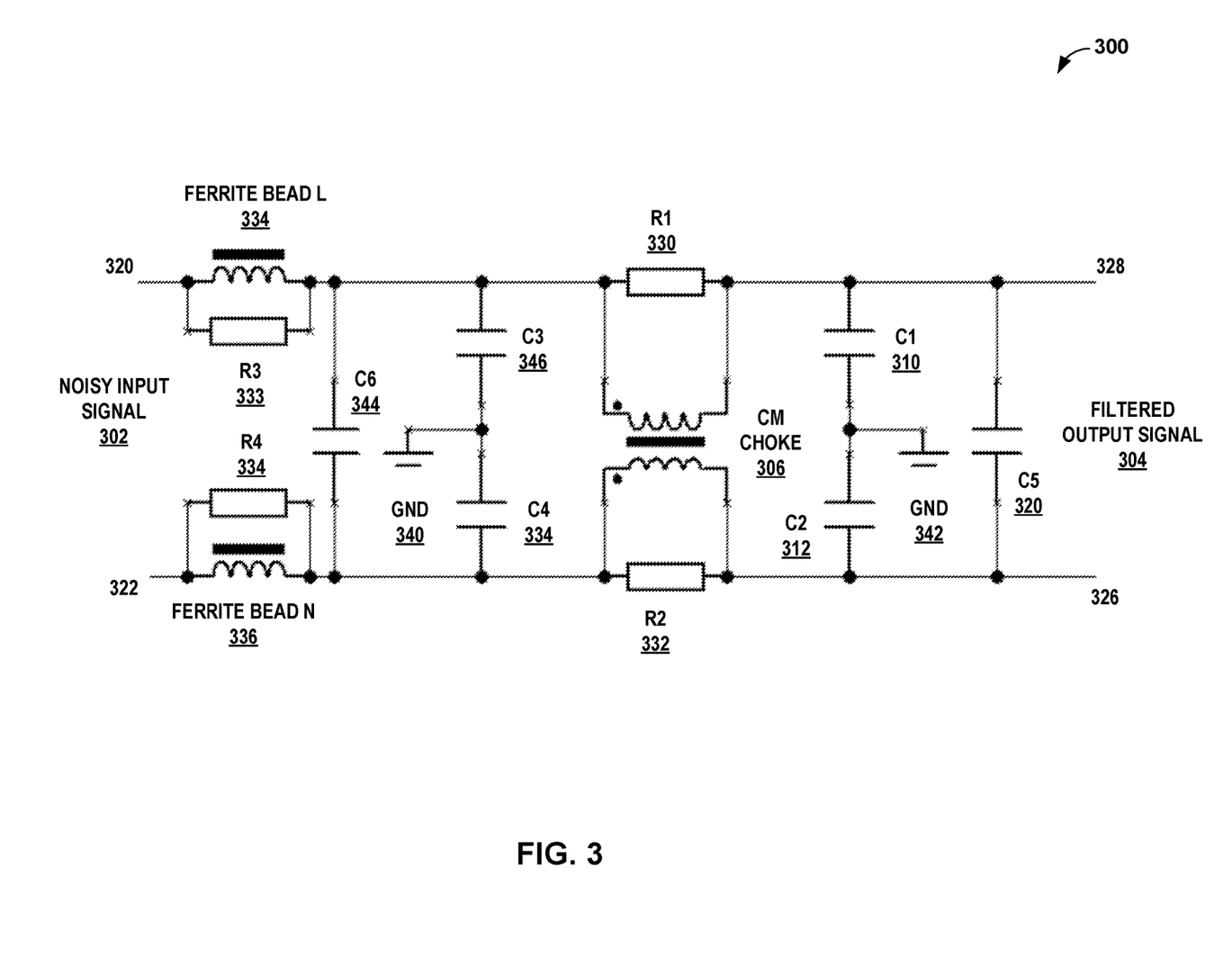
FIG. 3 is a schematic diagram illustrating a second example of a feedback filter circuit according to one or more techniques of this disclosure.

FIG. 3 is a schematic diagram illustrating a second example of a feedback filter circuit according to one or more techniques of this disclosure. As with circuit 200, circuit 300 is one possible example of a filter circuit for feedback signal filters 102A-102X described above in relation to FIG. 1. The example of circuit 300 provides for a variety of optional configurations to implement a filter circuit based on the type of unwanted noise to be filtered from the feedback signal.

Noisy input signal 302 enters circuit 300 via input terminal 320 and input terminal 322. In the example of FIG. 3, input terminal 320 and output terminal 328 may be considered the line terminals and input terminal 322 and output terminal 326 may be considered the neutral terminals. Filtered output signal 304 leaves circuit 300 via output terminals 328 and 326.

Common mode choke 306 and capacitors C1 310 and C2 312 are examples of common mode choke 206 and capacitors C1 210 and C2 212 and have the same functions and characteristics described above in relation to circuit 200. In addition, resistor R1 330 connects the line terminals of common mode choke 306, while resistor R2 332 connects the neutral terminals of common mode choke 306. In some examples, resistor R1 330 and/or resistor R2 332 may be high resistance or omitted as an open circuit when using common mode choke 306 in circuit 300. In other examples, resistor R1 330 and/or resistor R2 332 may have a very low resistance or act as a short circuit to bypass and remove common mode choke 306 from circuit 300. In this manner resistors R1 330 and R2 332 provide for a variety of optional configurations to implement the filter circuit of circuit 300.

Similarly, resistor R3 333 and R4 334 may be omitted as an open circuit when using ferrite bead L 334 and ferrite bead N 336. Resistor R3 333 and R4 334 may be a low resistance or short circuit to bypass and remove ferrite bead L 334 and ferrite bead N 336 from circuit 300.

Ferrite bead L 334 connects input terminal 320 to the input line terminal of common mode choke 306. Ferrite bead N 336 connects input terminal 322 to the input neutral terminal of common mode choke 306. Ferrite bead L 334 and ferrite bead N 336 act as a single choke to reduce or eliminate differential mode noise, e.g. blocking the high-frequency AC noise while letting the DC or lower frequency AC signal pass. As with a common mode choke, selecting the size and other characteristics of ferrite bead L 334 and ferrite bead N 336 may determine the frequencies to be attenuated.

Capacitor C6 344 connects the line terminal and neutral terminal of common mode choke 306. Capacitor C6 344 may couple differential AC signals between the line and neutral paths of circuit 300.

Similar to capacitors C1 310 and C2 312, capacitor C3 346 connects in series with capacitor C4 334 to connect the line terminal and neutral terminal of common mode choke 306 in parallel with capacitor C6 344. The node between capacitor C3 346 and capacitor C4 334 connects to GND 340. GND 340 and GND 342 may connect to electrical machine 106 via EMC braid 104 as described above in relation to FIG. 1.

Capacitor C5 320 connects line output terminal 328 and neutral output terminal 326. Similar to capacitor C6 344, capacitor C5 320 may couple differential AC signals between the line and neutral output terminals 328 and 326 of circuit 300. Selecting various combinations of components, as well as component characteristics, e.g. capacitance, resistance value and so on, determines the filter characteristics of circuit 300.

Figure 4:
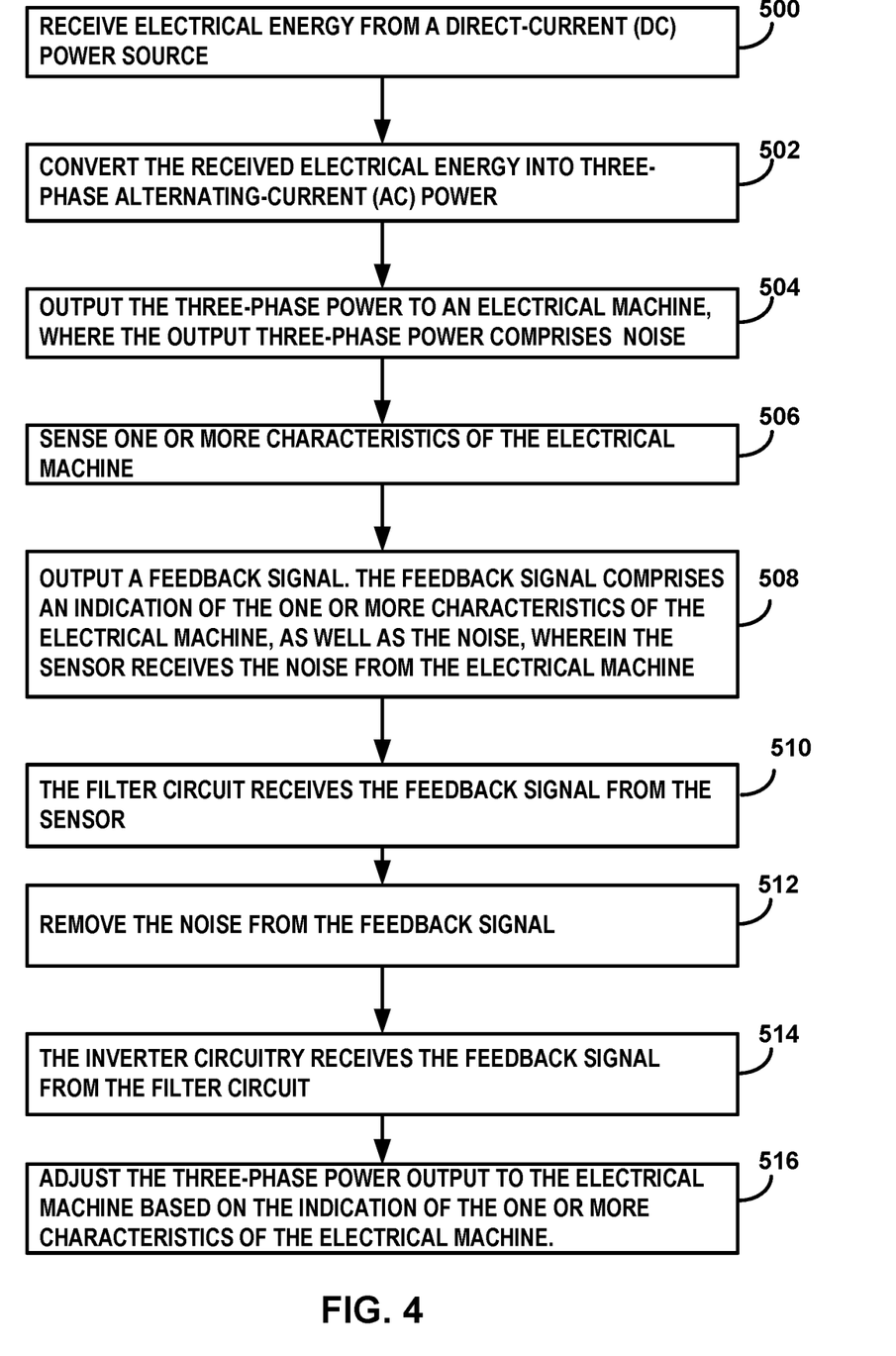
FIG. 4 is a flowchart illustrating an example operation of the system of this disclosure.

FIG. 4 is a flowchart illustrating an example operation of the system of this disclosure. The blocks of FIG. 4 will be described in terms of FIG. 1, unless otherwise noted.

As described above in relation to FIG. 1, inverter circuitry 108 may receive electrical energy from DC power source 112 (500). In some examples, DC power source 112 may be implemented as a battery, including a rechargeable battery.

Inverter circuitry 108 is configured to convert the received electrical energy from DC power source 112 into AC power 116 (502). In some examples AC power 116 is three-phase electrical power. Inverter circuitry 108 may further output AC power 116 to electrical machine 106 (504). As described above in relation to FIG. 2, switching circuits of inverter circuitry 108 may superimpose noise, which may include one or more disturbances that may distort characteristics of AC power 116.

Sensors 118 may sense, e.g. measure, one or more characteristics of electrical machine 106 (506). Each sensor of sensors 118 may output a feedback signal (508). Because the noise from inverter circuitry 108 may couple to either the sensors, or the conductors carrying signals or power to and from sensors 118, the feedback signal may include both an indication of the one or more characteristics of the electrical machine, and the noise. In other words, the feedback signal may include a feedback information component and a noise component because the sensor receives the noise component, including one or more noise frequencies, from electrical machine 106.

Each of feedback signal filters 102A-102X may receive a respective feedback signal from a respective sensor, e.g. a temperature sensor or speed sensor (510). As described above in relation to FIGS. 2 and 3, the respective filter circuit of feedback signal filters 102A-102X may remove, or attenuate, the noise from the feedback signal (512). As described above in relation to FIG. 3, various filter configurations may be implemented in a respective feedback signal filter based on the expected information component and the noise component in the feedback signal.

Inverter circuitry 108, e.g. processing circuitry 110 connected to or part of inverter circuitry 108, may receive a respective feedback signal from feedback signal filters 102A-102X (514). Based on the indication of the one or more characteristics of the electrical machine in the information component of the feedback signal, processing circuitry 110 may adjust one or more settings of inverter circuitry 108 to adjust AC power 116 output to electrical machine 106 (516). Processing circuitry 110 may adjust any one or more of output voltage amplitude, frequency, or other characteristics of AC power 116.

In one or more examples, the functions described above may be implemented in hardware, software, firmware, or any combination thereof. For example, the various components of FIG. 1, such as processing circuitry 110 and feedback signal filters 102A-102X may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

The term "non-transitory" may indicate that the storage medium is not embodied in a carrier wave or a propagated signal. In certain examples, a non-transitory storage medium may store data that can, over time, change (e.g., in RAM or cache).

By way of example, and not limitation, such computer-readable storage media, may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include computer-readable storage media.

Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Combinations of the above should also be included within the scope of computer-readable media.

Instructions may be executed by one or more processors, such as one or more DSPs, general purpose microprocessors, ASICs, FPGAs, or other equivalent integrated or discrete logic circuitry. Accordingly, the term "processor," and "processing circuitry" as used herein, may refer to any of the foregoing structure or any other structure suitable for implementation of the techniques described herein. Also, the techniques could be fully implemented in one or more circuits or logic elements.

The techniques of this disclosure may be implemented in a wide variety of devices or apparatuses, including, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

Various examples of the disclosure have been described. These and other examples are within the scope of the following claims.

What is claimed is:

1. A closed-loop system comprising:
   an electrical machine comprising a housing and configured to drive a mechanical load;
   an inverter circuitry configured to provide power to the electrical machine;
   a sensor located within the housing and configured to measure a characteristic of the electrical machine and output a first signal indicating the measured characteristic; and
   a filter circuit configured to:
      receive the first signal from the sensor;
      remove noise from the first signal;
      output a second signal indicating the measured characteristic; and
   processing circuitry configured to:
      receive the second signal;
      adjust closed-loop operation of the inverter circuitry based on the measured characteristic.

2. The system of claim 1, wherein the filter circuit comprises one or more resistors configured to provide optional configurations to implement the filter circuit.

3. The system of claim 1, wherein the filter circuit is located adjacent or inside the housing of the electrical machine such that the filter circuit is configured to prevent noise from the first signal from coupling to one or more circuits outside the electrical machine.

4. The system of claim 1, wherein the sensor comprises a resolver configured to measure a speed and a position of the electrical machine.

5. The system of claim 4, wherein the position of the electrical machine comprises an angular deviation from a reference angle.

6. The system of claim 1, wherein the sensor comprises a temperature sensor configured to measure an operating temperature of the electrical machine.

7. The system of claim 1, wherein the filter circuit comprises a common mode choke circuit.

8. The system of claim 7, wherein the filter circuit comprises a first capacitor in series with a second capacitor, and the first capacitor and second capacitor are in parallel with the common mode choke circuit.

9. A method comprising:
   receiving, by an inverter circuitry, electrical energy from a direct-current (DC) power source;
   converting, by the inverter circuitry, the received electrical energy into three-phase alternating-current (AC) power;
   outputting, by the inverter circuitry, the three-phase power to an electrical machine, wherein the output three-phase power comprises a noise component;
   sensing, by a sensor, one or more characteristics of the electrical machine;
   outputting, by the sensor, a feedback signal, wherein the feedback signal comprises:
      an indication of the one or more characteristics of the electrical machine, and
      the noise component, wherein the sensor receives the noise component from the electrical machine;
   receiving, by a filter circuit, the feedback signal from the sensor;
   removing, by the filter circuit, the noise component from the feedback signal and outputting a filtered feedback signal comprising the indication of the one or more characteristics of the electrical machine;
   receiving, by the inverter circuitry, a control signal based on the filtered feedback signal from the filter circuit and the indication of the one or more characteristics of the electrical machine; and
   adjusting, by the inverter circuitry, the output of the three-phase power to the electrical machine based on the control signal.

10. The method of claim 9, wherein the filter circuit is located adjacent or inside the electrical machine such that the filter circuit is configured to prevent noise from the feedback signal from coupling to circuits outside the electrical machine.

11. The method of claim 9, wherein the sensor comprises a resolver configured to measure a speed and a position of the electrical machine.

12. The method of claim 11, wherein the position of the electrical machine comprises an angular deviation from a reference angle.

13. The method of claim 9, wherein the sensor comprises a temperature sensor configured to measure an operating temperature of the electrical machine.

14. The method of claim 9, wherein the filter circuit comprises:
   a single choke circuit configured to act on differential mode noise; and
   a resistor in parallel with the single choke circuit, wherein the resistor is configured to provide for a variety of optional configurations to implement the filter circuit.

15. The method of claim 9, wherein the filter circuit comprises a first capacitor in series with a second capacitor, and the first capacitor and second capacitor are in parallel with a common mode choke circuit.

16. An apparatus comprising:
   an electrical machine configured to receive alternating current (AC) power from an AC power source and drive a mechanical load; and
   a filter circuit configured to:
      receive a feedback signal from a sensor, wherein the feedback signal comprises a feedback information component and a noise component;
      remove the noise component from the feedback signal; and
      output the feedback signal comprising the feedback information component to the AC power source,
         wherein the filter circuit is located within a housing of the electrical machine and wherein the feedback information component includes an indication of one or more characteristics of the electrical machine, and
         wherein the AC power source is configured to adjust the AC power to the electrical machine based on the indication of the one or more characteristics of the electrical machine.

17. The apparatus of claim 16, wherein the sensor is a first sensor and the filter circuit is a first filter circuit, the apparatus further comprising a second filter circuit located on the exterior of the housing, the second filter circuit is configured to:
   receive a second feedback signal from a second sensor, wherein the second feedback signal comprises a second feedback information component and the noise component;
   remove the noise component from the second feedback signal; and
   output the second feedback signal comprising the second feedback information component.

18. The apparatus of claim 16, wherein the sensor comprises at least one of: a resolver configured to measure a speed and a position of an electrical machine, a temperature sensor, a current sensor configured to measure a magnitude of current, an impedance sensor, a volt-ampere reactive (vars) sensor, and a radiated emission sensor.

19. The apparatus of claim 16, wherein the filter comprises a common mode choke circuit.

20. The apparatus of claim 19, wherein the filter comprises a first capacitor in series with a second capacitor, and the first capacitor and second capacitor are in parallel with the common mode choke circuit.

\* \* \* \* \*